(12) United States Patent
Otsuka

(10) Patent No.: US 7,979,821 B2
(45) Date of Patent: Jul. 12, 2011

(54) METHOD OF VERIFYING SEMICONDUCTOR INTEGRATED CIRCUIT AND DESIGN PROGRAM

(75) Inventor: Yasuo Otsuka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 574 days.

(21) Appl. No.: 12/149,910

(22) Filed: May 9, 2008

(65) Prior Publication Data
US 2008/0313585 A1 Dec. 18, 2008

(30) Foreign Application Priority Data
May 14, 2007 (JP) ................................ 2007-127577

(51) Int. Cl.
*G06F 17/50* (2006.01)
(52) U.S. Cl. ........ 716/106; 716/111; 716/114; 716/118; 716/119
(58) Field of Classification Search .......... 716/106–107, 716/110–114, 118–119
See application file for complete search history.

(56) References Cited

U.S. PATENT DOCUMENTS
2005/0229132 A1* 10/2005 Butt et al. ...................... 716/10

FOREIGN PATENT DOCUMENTS
JP    2006-155524    6/2006
* cited by examiner

*Primary Examiner* — Paul Dinh
(74) *Attorney, Agent, or Firm* — McGinn IP Law Group, PLLC

(57) ABSTRACT

A method of verifying a semiconductor integrated circuit is provided. A controlling cell and a controlled cell controlled by a control signal output from the controlling cell are placed in an IO region of the semiconductor integrated circuit. The method includes: (A) providing a library that includes requirement information specifying the controlling cell required by the controlled cell; (B) obtaining a region information indicating a region within the IO region in which a signal interconnection through which the control signal is transmitted is provided; and (C) verifying whether or not the specified controlling cell is placed within the region, in a case where the controlled cell is placed within the region.

12 Claims, 19 Drawing Sheets

Fig. 6

REQUIRE INFORMATION OF LVDS BUFFER

[SIGNAL ATTRIBUTE]     LVDS

[REQUIRING CELL GROUP]     LVDS_INPUT

Fig. 7

GROUP INFORMATION OF LVDS DRIVER CELL

[SIGNAL ATTRIBUTE]     LVDS

[CELL GROUP]     LVDS_INPUT

Fig. 8

REGION INFORMATION

| SIGNAL ATTRIBUTE | REGION |
|---|---|
| LVDS | R1 |
| LVDS | R2 |

Fig. 14

- FIRST IOLH BUFFER 51
  <REQUIRE INFORMATION> = [SIGNAL ATTRIBUTE] IOLH25, [REQUIRING CELL GROUP] IOLH25
- SECOND IOLH BUFFER 52
  <REQUIRE INFORMATION> = [SIGNAL ATTRIBUTE] IOLH33, [REQUIRING CELL GROUP] IOLH33
- FIRST IOLH CONTROLLER 53
  <GROUP INFORMATION> = [SIGNAL ATTRIBUTE] IOLH25, [CELL GROUP] IOLH25
  <REQUIRE INFORMATION> = [SIGNAL ATTRIBUTE] IOLHEN, [REQUIRING CELL GROUP] IOLHEN
- SECOND IOLH CONTROLLER 54
  <GROUP INFORMATION> = [SIGNAL ATTRIBUTE] IOLH33, [CELL GROUP] IOLH33
  <REQUIRE INFORMATION> = [SIGNAL ATTRIBUTE] IOLHEN, [REQUIRING CELL GROUP] IOLHEN
- IOLH ENABLE CELL 55
  <GROUP INFORMATION> = [SIGNAL ATTRIBUTE] IOLHEN, [CELL GROUP] IOLHEN

Fig. 15

REGION INFORMATION

| SIGNAL ATTRIBUTE | REGION |
|---|---|
| IOLH 25 | R1 (2.5 V REGION) |
| IOLH 33 | R2 (3.3 V REGION) |
| IOLHEN | R3 (ENTIRE REGION) |

METHOD OF VERIFYING SEMICONDUCTOR INTEGRATED CIRCUIT AND DESIGN PROGRAM

BACKGROUND OF THE INVENTION

1. Field of the Invention

The present invention relates to a technique of verifying a semiconductor integrated circuit. In particular, the present invention relates to a technique of verifying placement of IO cells in an IO region of a semiconductor integrated circuit.

This application is based upon and claims the benefit of priority from Japanese patent application No. 2007-127577, filed on May 14, 2007, the disclosure of which is incorporated herein in its entirely by reference.

2. Description of Related Art

FIG. 1 is a flowchart showing a typical method of designing a semiconductor integrated circuit. First, a cell library is prepared (Step S1). The cell library consists of cell data of various kinds of cells. The various kinds of cells include a macro cell, a primitive cell, an IO cell and the like.

Next, floor planning is performed based on a user netlist (Step S2). In the floor planning, locations of macro cells and paths of power lines are roughly determined. Next, IO cells are placed in an IO region based on the result of the floor planning (Step S3). The IO region (peripheral region) is peripheral to a layout region. Subsequently, power routing is performed in which a layout of power lines and ground lines are determined (Step S4). Next, placement of primitive cells and routing of signal interconnections are performed (Step S5). As a result, a layout data indicating a layout of a design circuit is completed (Step S6).

After that, verification of the layout data is performed (Step S7). The layout verification includes DRC (Design Rule Check), LVS (Layout Versus Schematic) and the like. In the DRC, it is verified whether or not the layout meets the design rule. In the LVS, it is verified whether or not the layout accords with the user netlist, namely, whether or not elements and connections between the elements in a logic design stage are correctly reproduced in the layout.

A representative one of the above-mentioned IO cells is an input-output buffer. In general, only information of the input and the output is given to the cell data of the input-output buffer. Therefore, it has been difficult to perform the LVS verification in consideration of a power line and a ground line within the input-output buffer. A technique for solving the problem is disclosed in Japanese Laid-Open Patent Application JP-2006-155524.

According to a method of verifying a semiconductor integrated circuit described in Japanese Laid-Open Patent Application JP-2006-155524, "physical information" is given to the cell data of the input-output buffer. The physical information indicates locations of a power line and a ground line within the input-output buffer. In the LVS verification, placement verification of input-output buffers is performed based on the physical information. Consequently, it becomes possible to verify a connection of the power line between adjacent input-output buffers.

The inventor of the present application has recognized the following points. There exist an IO cell having a certain function and another cell for driving the IO cell in the IO region of a semiconductor integrated circuit. The former is referred to as a "controlled cell" and the latter is referred to as a "controlling cell" hereinafter. The controlling cell outputs a control signal for controlling an operation of the controlled cell, and the controlled cell is controlled by the control signal output by the controlling cell. That is to say, the controlled cell depends on the controlling cell. In order that the controlled cell operates normally, both of the controlled cell and the controlling cell need to be placed in a region through which the control signal is transmitted. If the controlling cell is not placed in the region, the controlled cell can not operate normally. Such a placement error should be detected during the layout design/verification stage.

However, the user netlist does not include information on the dependence relationship between the controlling cell and the controlled cell. Therefore, it is not possible in the typical LVS verification to detect an error that the controlling cell required by the controlled cell does not exist. If such a placement error is overlooked, a product does not operate normally.

SUMMARY

In one embodiment of the present invention, a method of verifying a semiconductor integrated circuit is provided. The semiconductor integrated circuit has a controlling cell and a controlled cell controlled by a control signal output from the controlling cell which are placed in an IO region. The verification method includes: (A) providing a library that includes requirement information specifying the controlling cell required by the controlled cell; (B) obtaining a region information indicating a region within the IO region in which a signal interconnection through which the control signal is transmitted is provided; and (C) verifying whether or not the specified controlling cell is placed within the above-mentioned region, in a case where the controlled cell is placed within the above-mentioned region.

The dependence relationship between the controlling cell and the controlled cell is not indicated in the user netlist. Therefore, the information indicating the dependence relationship is provided as the library. In particular, the "requirement information" that specifies (designates) the controlling cell required by the controlled cell is provided as the library.

The controlling cell and the controlled cell are associated with each other through the control signal within the IO region. The "region information" indicates the region in which the signal interconnection through which the control signal is transmitted is provided. The region information may be prepared in advance and provided as a library. Alternatively, the region information may be generated based on an arrangement of a plurality of IO cells in the IO region.

In order that the controlled cell operates normally, both of the controlled cell and the controlling cell need to be placed in the region through which the control signal is transmitted. The placement of the controlling cell and the controlled cell can be verified by the use of the above-mentioned "requirement information" and "region information". More specifically, in a case where the controlled cell is placed within the region indicated by the region information, it is verified whether or not the controlling cell specified by the requirement information is placed within the same region. That is to say, it is possible to confirm whether or not the controlling cell required by the controlled cell exists in the region.

As described above, it is possible according to the present invention to detect absence of the controlling cell required by the controlled cell, which can not be found by the conventional LVS verification. In other words, it is possible to check validity of the placement of the controlling cell and the controlled cell and to verify whether or not the controlled cell operates normally. As a result, product deficiency caused by a placement error can be prevented, which improves production yield.

Moreover, according to the present invention, it is possible to perform the placement verification of the IO cells before the LVS verification. If the placement of IO cells in the IO region is at least completed, the placement verification of the IO cells is possible. For example, it is possible to perform the placement verification of the IO cells immediately after the IO cell placement process. In this case, a placement error of the IO cells can be detected prior to a power routing process and a cell placement/routing process. Since the placement error of the IO cells can be found in an early stage, TAT (Turn Around Time) can be greatly reduced.

According to the present invention, it is possible to verify validity of the placement of IO cells having a dependence relationship. Consequently, product deficiency caused by a placement error of the IO cells can be prevented, which improves production yield.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 shows an example of REQUIRE information with regard to the LVDS buffer;

FIG. 7 shows an example of GROUP information with regard to the LVDS driver cell;

FIG. 8 shows an example of region information in the first embodiment;

FIG. 14 shows an example of REQUIRE information and GROUP information in the second embodiment;

FIG. 15 shows an example of region information in the second embodiment;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. First Embodiment 1-1. Design System and Operation

Figure 1:
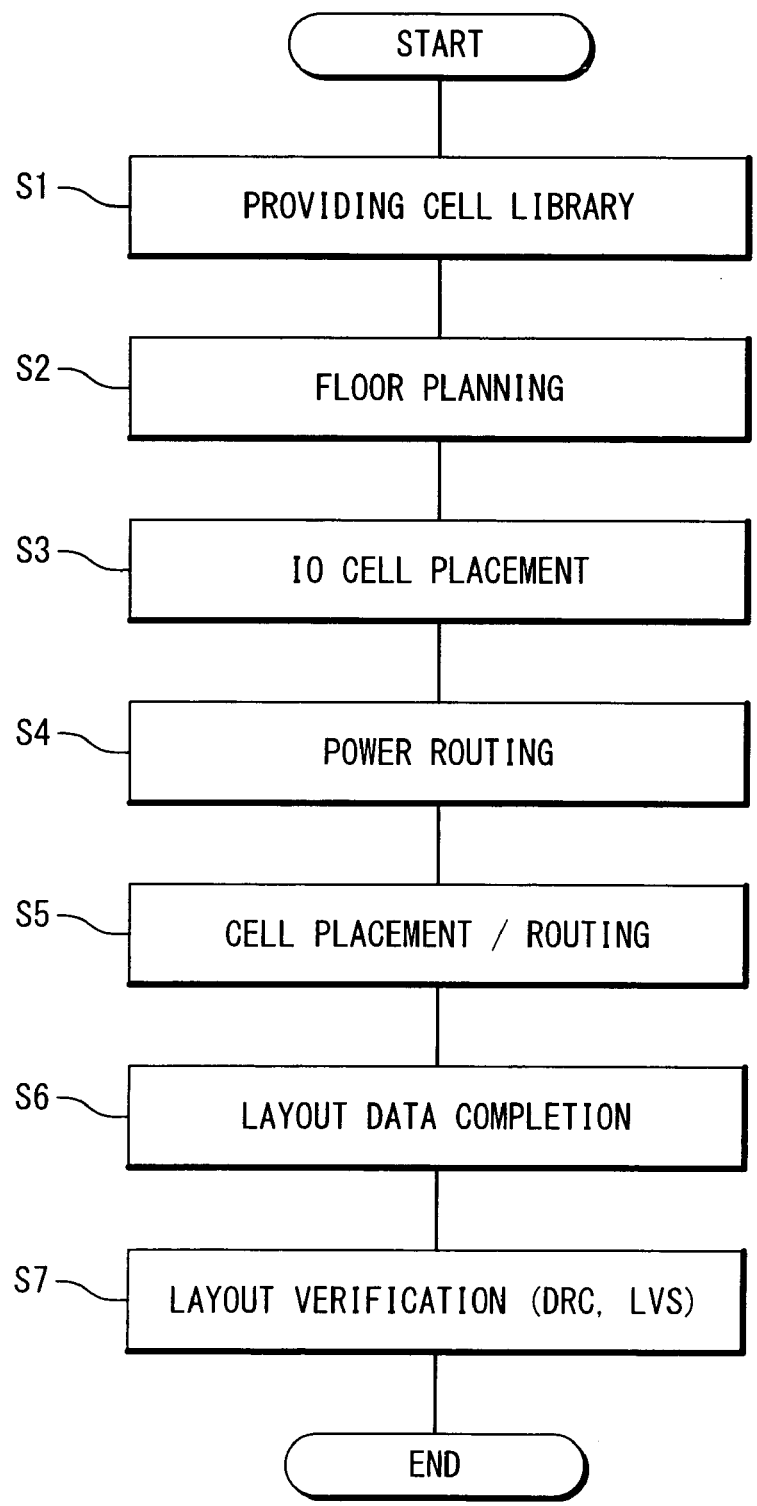
FIG. 1 is a flowchart showing a typical method of designing a semiconductor integrated circuit.
Figure 2:
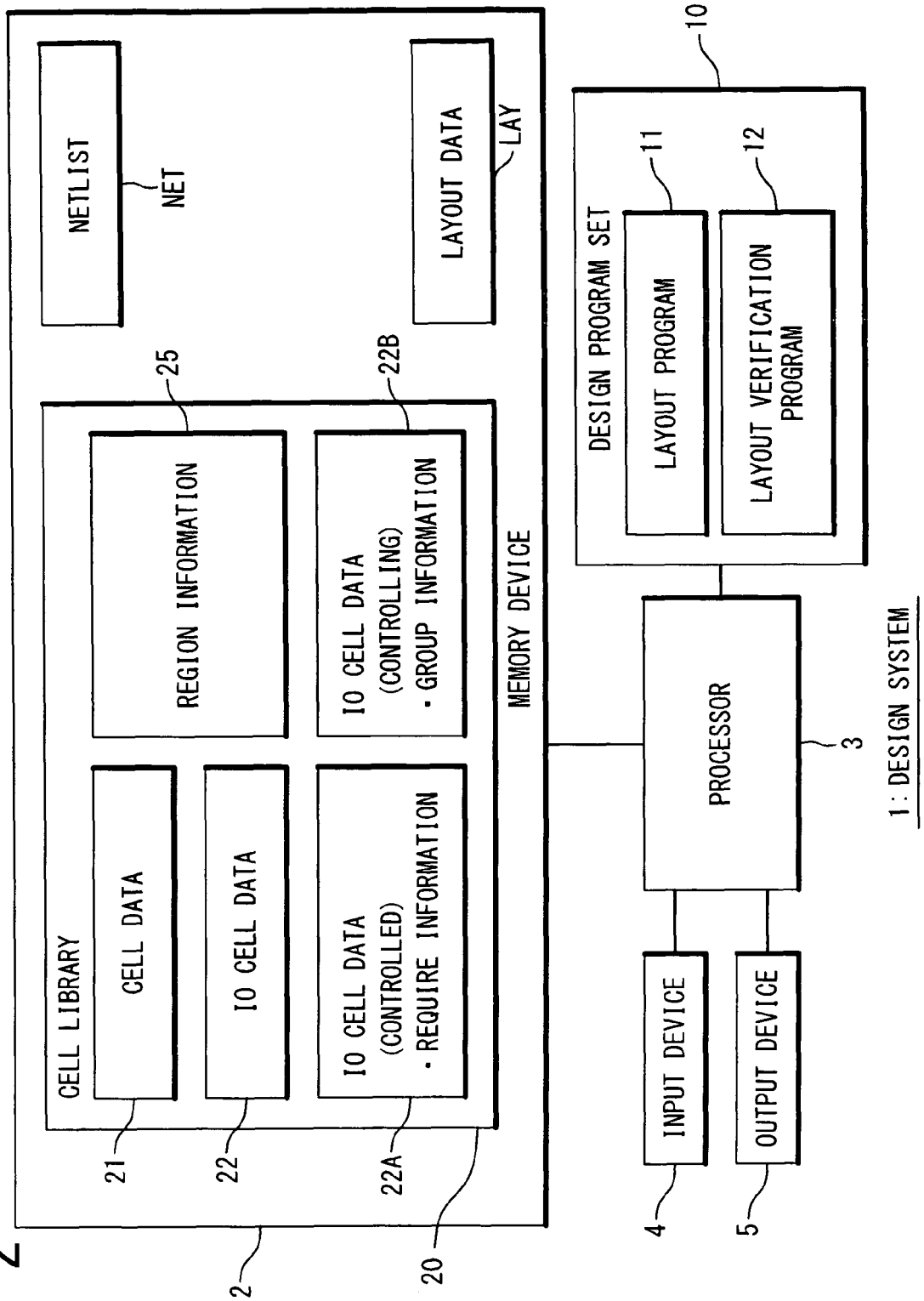
FIG. 2 is a block diagram showing a configuration of a design system according to a first embodiment of the present invention.

FIG. 2 is a block diagram showing a configuration example of a design system 1 according to a first embodiment of the present invention. The design system 1 is achieved by a computer system and includes a memory device 2, a processor 3, an input device 4, an output device 5 and a design program set 10. The memory device 2 includes a RAM and an HDD. The processor 3 controls operations of respective devices and executes data processing. The input device 4 includes a key board and a mouse. The output device 5 includes a display.

The design program set 10 is software executed by the processor 3 and includes a layout program 11 and a layout verification program 12. These programs 11 and 12 may be recorded on a computer-readable recording medium and read out from the recording medium to the memory device 2. The designing of a semiconductor integrated circuit according to the present embodiment is achieved by cooperation of the processor 3 and the design program set 10. More specifically, the processor 3 carries out a layout process of the design circuit in accordance with instructions of the layout program 11. Also, the processor 3 carries out a layout verification process such as the DRC and the LVS in accordance with instructions of the layout verification program 12.

Stored in the memory device 2 are a netlist NET, a layout data LAY, a cell library 20 and so on. The netlist NET is information indicating elements and connections between the elements in the design circuit. The layout data LAY indicates a layout of the design circuit.

The cell library 20 includes cell data 21, IO cell data 22 and region information 25. The cell data 21 are data of macro cells and primitive cells that are to be placed within an internal region of the design circuit. The IO cell data 22 are data of plural kinds of IO cells that are to be placed within an IO region of the design circuit. The IO cells include a "controlled cell" and a "controlling cell" which drives the controlled cell. The controlling cell outputs a control signal for controlling an operation of the controlled cell, and the controlled cell is controlled by the control signal output by the controlling cell. The IO cell data 22 for the controlled cell is particularly referred to as "IO cell data 22A", and the IO cell data 22 for the controlling cell is particularly referred to as "IO cell data 22B" hereinafter. The details of the IO cell data 22A, 22B and the region information 25 will be described later (see Section 1-3).

Figure 3:
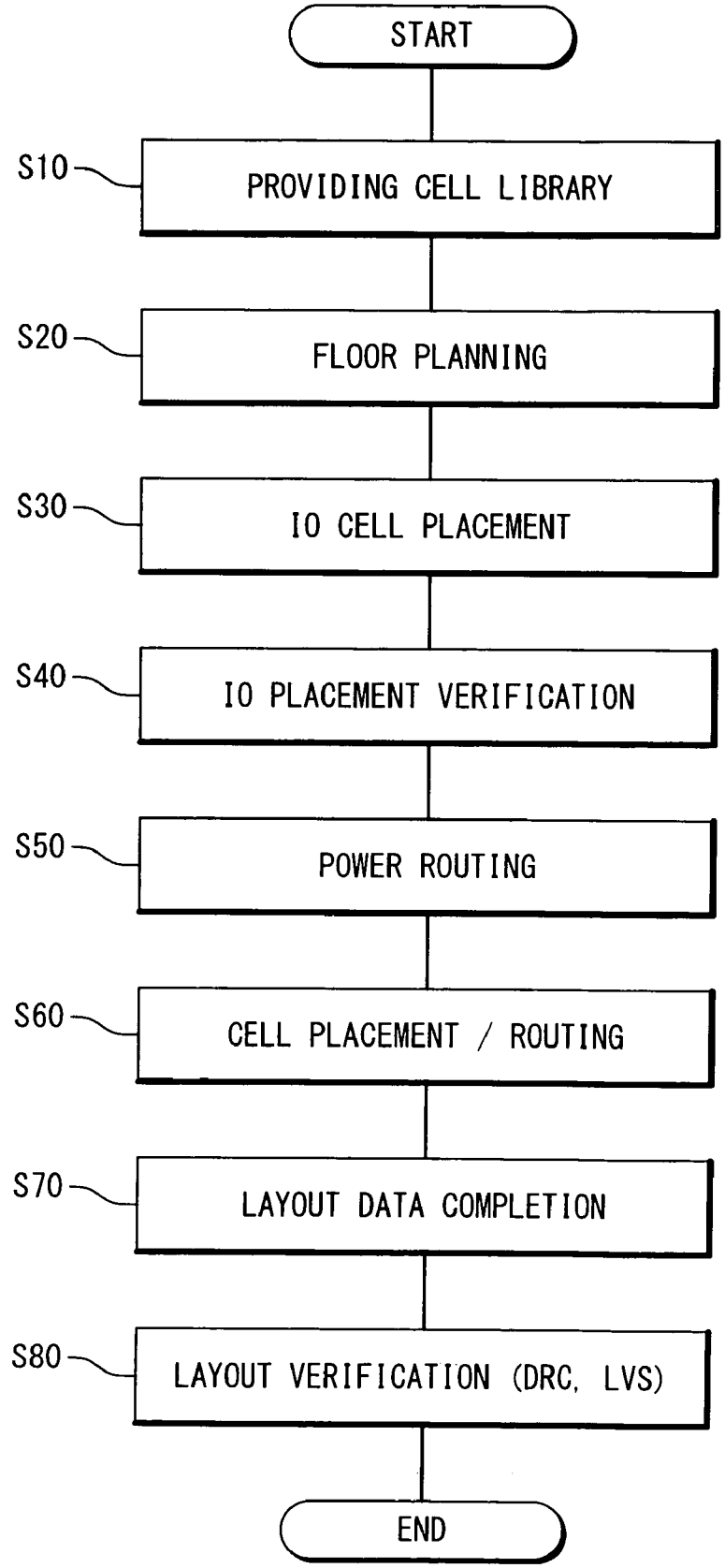
FIG. 3 is a flowchart showing a method of designing a semiconductor integrated circuit according to the embodiment of the present invention.

FIG. 3 is a flowchart showing a method of designing a semiconductor integrated circuit according to the present embodiment. First, the cell library 20 shown in FIG. 2 is prepared and provided (Step S10). The details of the cell library 20 will be described later (see Section 1-3).

Next, the processor 3 executes the layout program 11 to achieve the layout process of the design circuit. More specifically, the processor 3 first reads the netlist NET and the cell library 20 from the memory device 2. Next, the processor 3 performs floor planning based on the netlist NET (Step S20). In the floor planning, locations of macro cells and paths of power lines are roughly determined.

Next, the processor 3 places various IO cells in the IO region by using the IO cell data 22, 22A and 22B (Step S30). The placement (arrangement) of the IO cells is determined by the result of the floor planning, for example. After that, the processor 3 verifies (checks) validity of the placement of the IO cells within the IO region (Step S40). That is to say, the layout program 11 according to the present embodiment has a function of the placement verification of the IO cells. The details of the verification process of the IO cell placement will be described later (see Section 1-4).

Furthermore, the processor 3 performs power routing to determine a layout of power lines and ground lines (Step S50). Moreover, the processor 3 places primitive cells and the like in the internal region by using the cell data 21, and performs routing of signal interconnections between the cells (Step S60). As a result, the layout data LAY of the design circuit is completed (Step S70). The generated layout data LAY is stored in the memory device 2.

Next, the processor 3 executes the layout verification program 12 to perform verification of the layout of the design circuit (Step S80). More specifically, the processor 3 reads the layout data LAY from the memory device 2 and performs the DRC and the LVS with respect to the layout data LAY.

Examples of the cell library 20 and the IO placement verification (Step S40) according to the present embodiment will be described below in more detail. Let us consider LVDS (Low Voltage Differential Signaling) that is a technique for achieving high-speed signal transmission as an example.

1-2. LVDS

Figure 4:
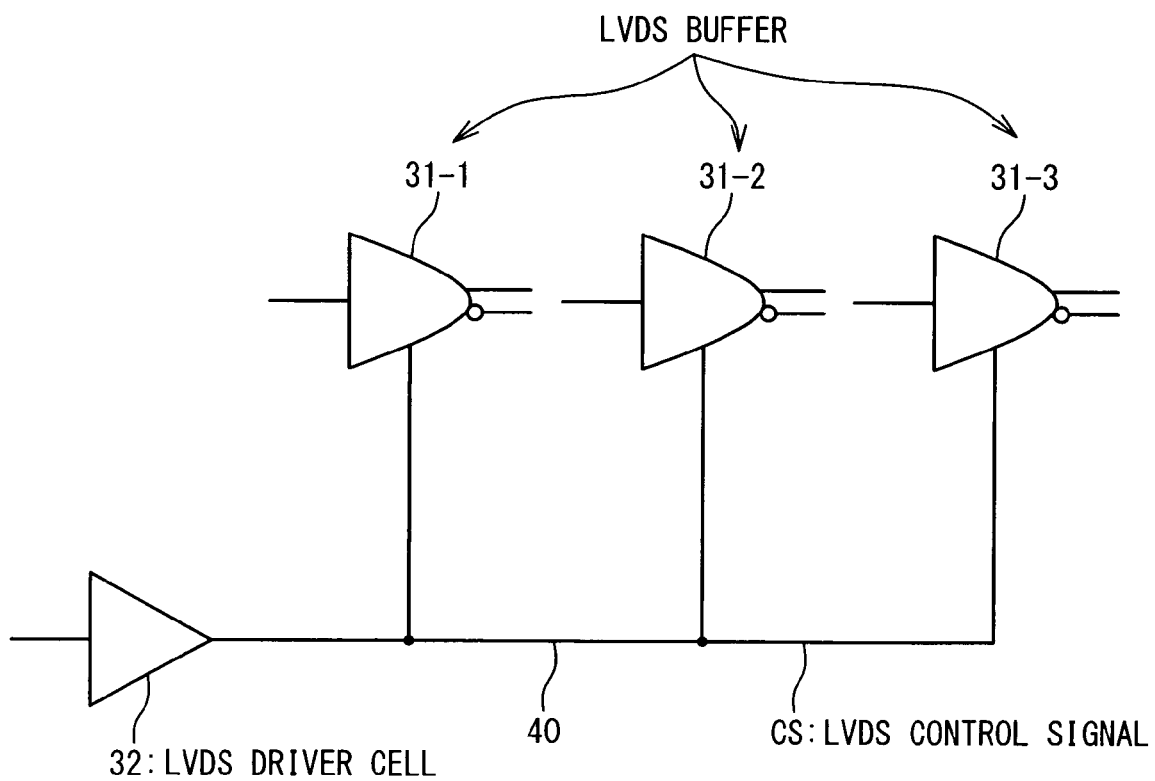
FIG. 4 is a circuit diagram showing a dependence relationship between an LVDS buffer and an LVDS driver cell in the first embodiment.

FIG. 4 is a circuit diagram for explaining the LVDS. An LVDS buffer 31 and an LVDS driver cell 32 are examples of the IO cells that are placed within the IO region. The LVDS buffer 31 is a buffer for outputting an LVDS signal. Three LVDS buffers 31-1 to 31-3 are illustrated in FIG. 4. The LVDS driver cell 32 is a circuit for driving the LVDS buffer 31. More specifically, the LVDS driver cell 32 includes a bias circuit and outputs an operation voltage of the LVDS buffer 31. The operation voltage is supplied to the LVDS buffer 31 through an interconnection 40. The LVDS buffer 31 operates based on the operation voltage. The LVDS driver cell 32 is capable of turning ON and OFF the output of the operation voltage.

In this manner, the operation of the LVDS buffer 31 is controlled by the output of the LVDS driver cell 32. The LVDS buffer 31 depends on the LVDS driver cell 32 and requires the LVDS driver cell 32. Therefore, the LVDS buffer 31 is the "controlled cell" and the LVDS driver cell 32 is the "controlling cell" in the example shown in FIG. 4. Also, the operation voltage output from the LVDS driver cell 32 corresponds to an "LVDS control signal CS" that controls the operation of the LVDS buffer 31. The interconnection 40 is a "control signal interconnection" through which the LVDS control signal CS is transmitted. The LVDS buffer 31 (controlled cell) and the LVDS driver cell 32 (controlling cell) are associated with each other through the LVDS control signal CS propagating in the control signal interconnection 40.

Figure 5:
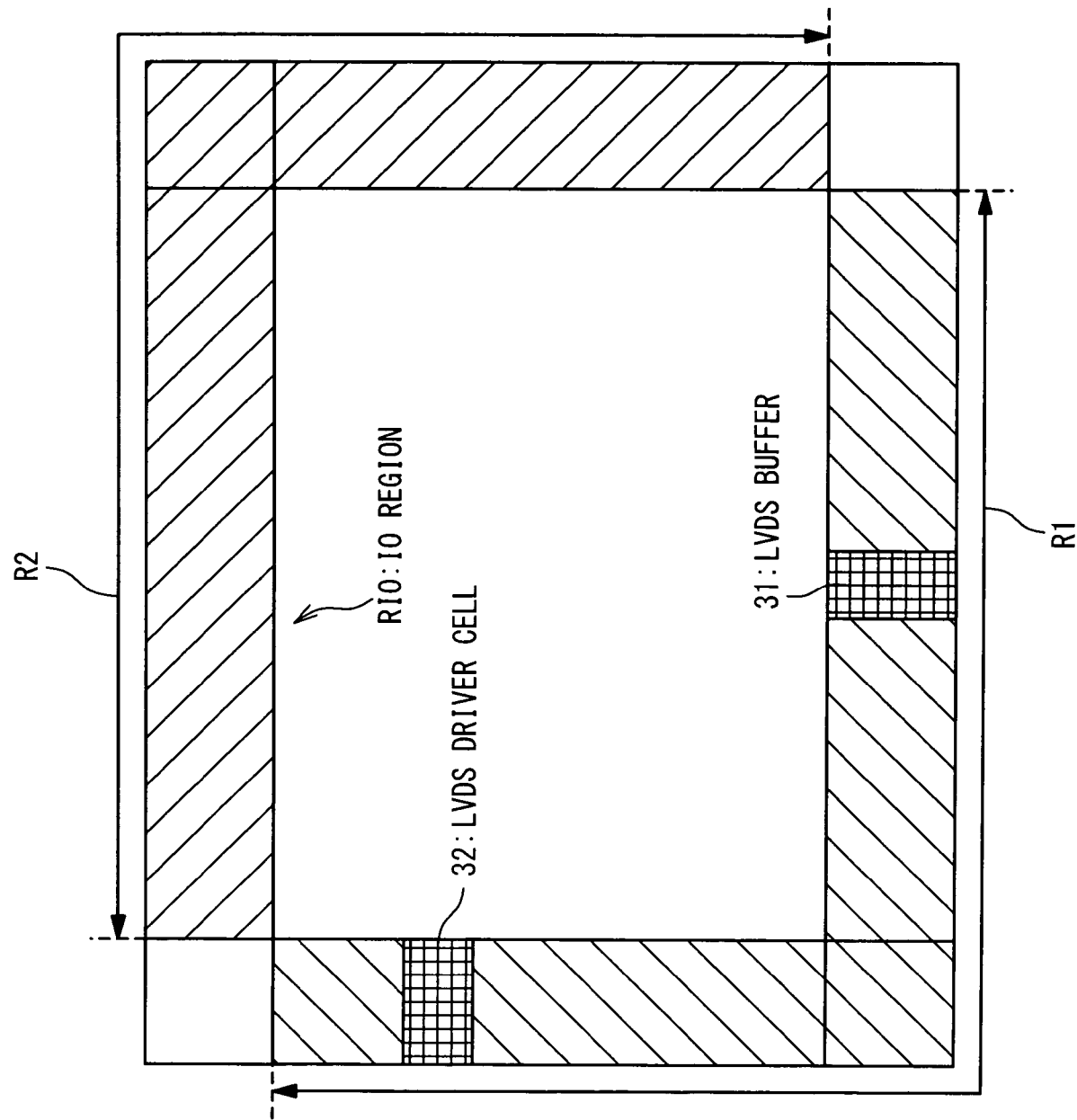
FIG. 5 is a schematic diagram showing an example of placement of the LVDS buffer and the LVDS driver cell in an IO region.

FIG. 5 shows an example of the placement of the LVDS buffer 31 and the LVDS driver cell 32. An IO region RIO is the peripheral region peripheral to the layout region. In the Step S30, plural kinds of IO cells including the LVDS buffer 31 and the LVDS driver cell 32 are placed within the IO region RIO.

As shown in FIG. 5, the IO region RIO is divided into a region R1 over the left side and the bottom side and a region R2 over the right side and the top side. Here, the control signal interconnection 40 through which the LVDS control signal CS is transmitted is prohibited from straddling both of the region R1 and the region R2. In other words, the control signal interconnection 40 is physically divided between the region R1 and the region R2. The control signal interconnection 40 is so formed as to close within each of the regions R1 and R2. It can be said that each of the regions R1 and R2 is a region over which a single LVDS control signal CS can be distributed.

In FIG. 5, an LVDS buffer 31 is placed within the region R1. The LVDS buffer 31 requires the LVDS driver cell 32 that outputs the LVDS control signal CS. In order that the LVDS buffer 31 operates normally, the LVDS driver cell 32 needs to be placed in the same region R1. That is to say, both of the LVDS buffer 31 and the LVDS driver cell 32 need to be placed within the same region R1 in which the control signal interconnection 40 is consecutively formed.

Moreover, in a case where two or more LVDS driver cells 32 exist in the same region R1, an output short-circuit occurs in at least one LVDS driver cell 32. Therefore, a plurality of LVDS driver cells 32 shall not exist within the same region R1.

The above is summarized as follows: in a case where an LVDS buffer 31 (controlled cell) is placed within a certain region, a single LVDS driver cell 32 (controlling cell) needs to be placed within the same region. According to the present embodiment, it is possible to verify whether or not such the placement has been performed. For that purpose, the following information is given to the cell library 20 according to the present embodiment.

1-3. Cell Library

The IO cell data 22A shown in FIG. 2 is cell data of the LVDS buffer 31 (controlled cell). The IO cell data 22A includes "REQUIRE information (requirement information)". The REQUIRE information specifies a type of the controlling cell required by the LVDS buffer 31 that is the controlled cell.

FIG. 6 shows one example of the REQUIRE information. The REQUIRE information consists of "signal attribute" and "requiring cell group". The signal attribute represents the associated control signal, and the requiring cell group represents the type of the required controlling cell. In the present example, an identification name "LVDS" that represents the LVDS control signal CS is given as the signal attribute. Also, an identification name "LVDS_INPUT" that represents a specific cell type is given as the requiring cell group.

The IO cell data 22B shown in FIG. 2 is cell data of the LVDS driver cell 32 (controlling cell). The IO cell data 22B includes "GROUP information". The GROUP information indicates a type of the self cell that is the controlling cell.

FIG. 7 shows one example of the GROUP information. The GROUP information consists of "signal attribute" and "cell group". As in the REQUIRE information, the signal attribute represents the associated control signal. On the other hand, the cell group represents the type of the self cell. In the present example, an identification name "LVDS" that represents the LVDS control signal CS is given as the signal attribute. Also, an identification name "LVDS_INPUT" that represents the type of the self cell is given as the cell group.

Note that the requiring cell group indicated by the REQUIRE information accords with the cell group indicated by the GROUP information. Note also that the requiring cell group and the cell group do not indicate a specific controlling cell but a specific type. Different controlling cells are regarded as the same type as long as they provide the same function.

FIG. 8 shows one example of the region information 25. The region information 25 indicates the regions R1 and R2 that are within the IO region RIO and in each of which the LVDS control signal CS is transmitted (see FIG. 5). That is to say, the region information 25 indicates the regions R1 and R2 in each of which the control signal interconnection 40 is consecutively provided. More specifically, as shown in FIG. 8, the region information 25 indicates a relationship between "signal attribute" and "region". The "signal attribute" represents a control signal in the IO region, and the "region" represents a region in which the control signal of the signal attribute is transmitted. It can be seen from FIG. 8 that the control signal of the signal attribute "LVDS" is transmitted within the region R1 or R2.

As described above, the IO cell data 22A, 22B and the region information 25 are associated with each other through the "signal attribute". It is possible by specifying a certain "signal attribute" to recognize a controlling cell, a controlled cell and a region which are associated with the specified signal attribute.

1-4. IO Placement Verification

Figure 9:
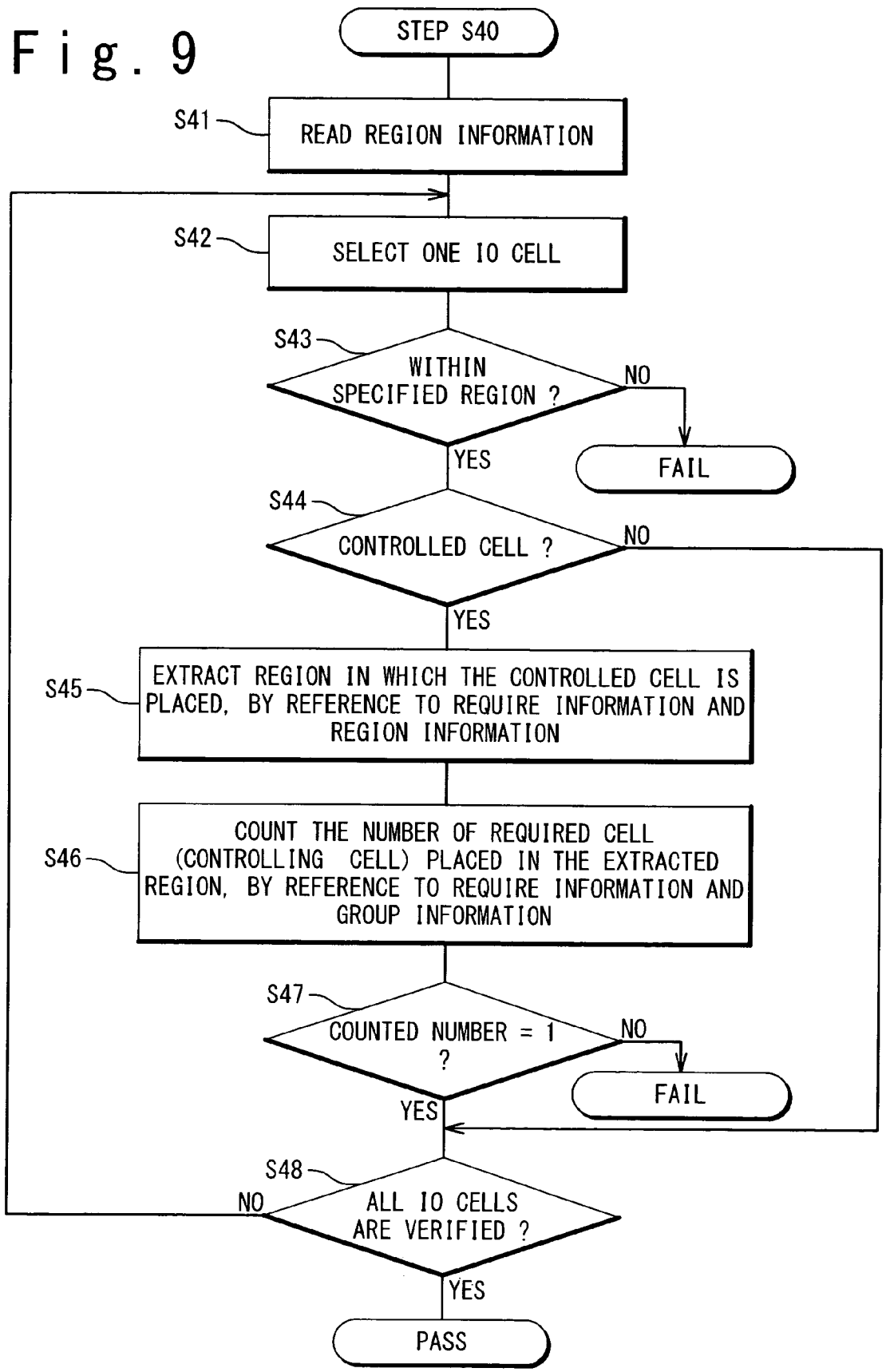
FIG. 9 is a flowchart showing an IO placement verification method according to the first embodiment.

After a plurality of IO cells are placed in the IO region RIO (Step S30), the placement verification of the IO cells is performed (Step S40). FIG. 9 is a flowchart showing the details of Step S40 according to the present embodiment.

The IO placement verification is performed based on the above-mentioned REQUIRE information, GROUP information and region information 25. The REQUIRE information and GROUP information are included in the cell data of the placed IO cells. The region information 25 is read out from the cell library 20 stored in the memory device 2 (Step S41). Thus, the region information 25 is obtained.

Next, one IO cell is selected from the plurality of IO cells placed within the IO region RIO (Step S42). The selected one IO cell is referred to as a "selected cell" hereinafter.

In a case where the selected cell is either the controlled cell or the controlling cell, there exists the REQUIRE information or the GROUP information. In this case, the "region" associated with the "signal attribute" indicated by the REQUIRE information or the GROUP information can be recognized by reference to the region information 25 (see FIG. 8). Then, it is verified whether or not the selected cell is placed within the region indicated (specified) by the region information 25.

If the selected cell is not placed in the specified region (Step S43; No), the placement of the selected cell is incorrect. Therefore, the verification result is FAIL. In the case of FAIL, an error signal is output and Step S40 is terminated. In response to the error signal, the foregoing Step S30 is executed again. On the other hand, if the selected cell is placed within the specified region (Step S43; Yes), the placement of the selected cell is at least correct. In this case, the processing proceeds to the next Step S44.

Next, it is judged whether the selected cell is the controlled cell (Step S44). In a case where the selected cell is other than the controlled cell (Step S44; No), no further verification is performed with respect to the current selected cell, and the processing proceeds to Step S48. On the other hand, in a case where the selected cell is the controlled cell (Step S44; Yes), it is verified whether or not the controlling cell required by the controlled cell exists within the same region. In other words, it is confirmed whether the dependence relationship with regard to the controlled cell is satisfied or not.

First, a region in which the controlled cell is placed is extracted as a verification target, by reference to the REQUIRE information and the region information 25 (Step S45). In the case of the example shown in FIG. 6 and FIG. 8, the signal attribute in the REQUIRE information is "LVDS" and thus it can be seen from the region information 25 that the region associated with the signal attribute "LVDS" is R1 and R2. Therefore, one of the regions R1 and R2 in which the controlled cell is placed is extracted as the verification target. For example, if the selected controlled cell is placed in the region R1, the region R1 is extracted as the verification target.

Next, a type of the controlling cell required by the controlled cell is recognized by reference to the REQUIRE information. In the case of the example shown in FIG. 6, the cell group "LVDS_INPUT" is required. Then, the number of controlling cell whose signal attribute and cell group are respectively "LVDS" and "LVDS_INPUT" is counted by reference to the GROUP information of cells placed within the above-mentioned extracted region R1. That is to say, the number of controlling cell that is placed within the extracted region R1 as the verification target and specified by the REQUIRE information is counted (Step S46).

In a case where the counted number is 0, the controlling cell for driving the controlled cell does not exist in the same region and thus the controlled cell can not operate normally. In a case where the counted number is two or more, an output short-circuit occurs as described above. That is to say, if the counted number is other than 1 (Step S47; No), the verification result is FAIL. In the case of FAIL, an error signal is output and Step S40 is terminated. In response to the error signal, the foregoing Step S30 is executed again. On the other hand, if the counted number is equal to 1 (Step S47; Yes), the dependence relationship with regard to the present controlled cell is satisfied, and the verification result is PASS.

The above-described flow is executed repeatedly with respect to every IO cells placed in the IO region RIO. When the verification is completed with respect to all the IO cells (Step S48; Yes), Step S40 is completed.

The foregoing FIG. 5 shows a case where the verification result is PASS. In FIG. 5, an LVDS buffer 31 (controlled cell) is placed within the region R1. The LVDS control signal CS is transmitted in the region R1 (Step S43; Yes). Moreover, only one LVDS driver cell 32 (controlling cell) required by the LVDS buffer 31 is placed within the region R1 (Step S47; Yes). Therefore, the LVDS buffer 31 can operate normally and an output short-circuit does not occur.

Figure 10:
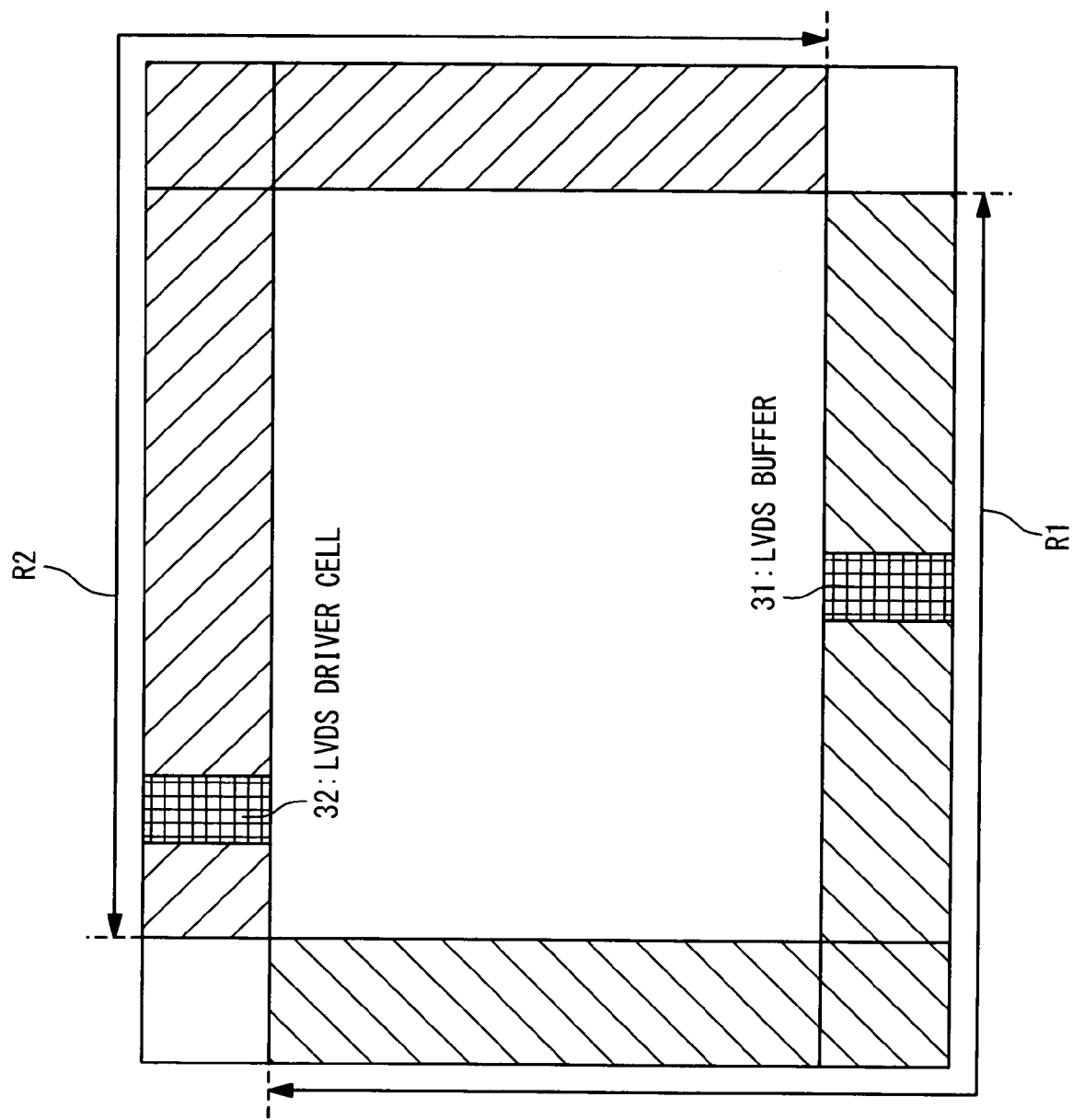
FIG. 10 is a schematic diagram showing another example of placement of the LVDS buffer and the LVDS driver cell in the IO region.

FIG. 10 shows a case where the verification result is FAIL. In FIG. 10, an LVDS buffer 31 is placed within the region R1. However, there is no LVDS driver cell 32 required by the LVDS buffer 31 in the same region R1 (Step S47; No). In this case, the LVDS buffer 31 can not operate normally. Therefore, the verification result is FAIL.

Figure 11:
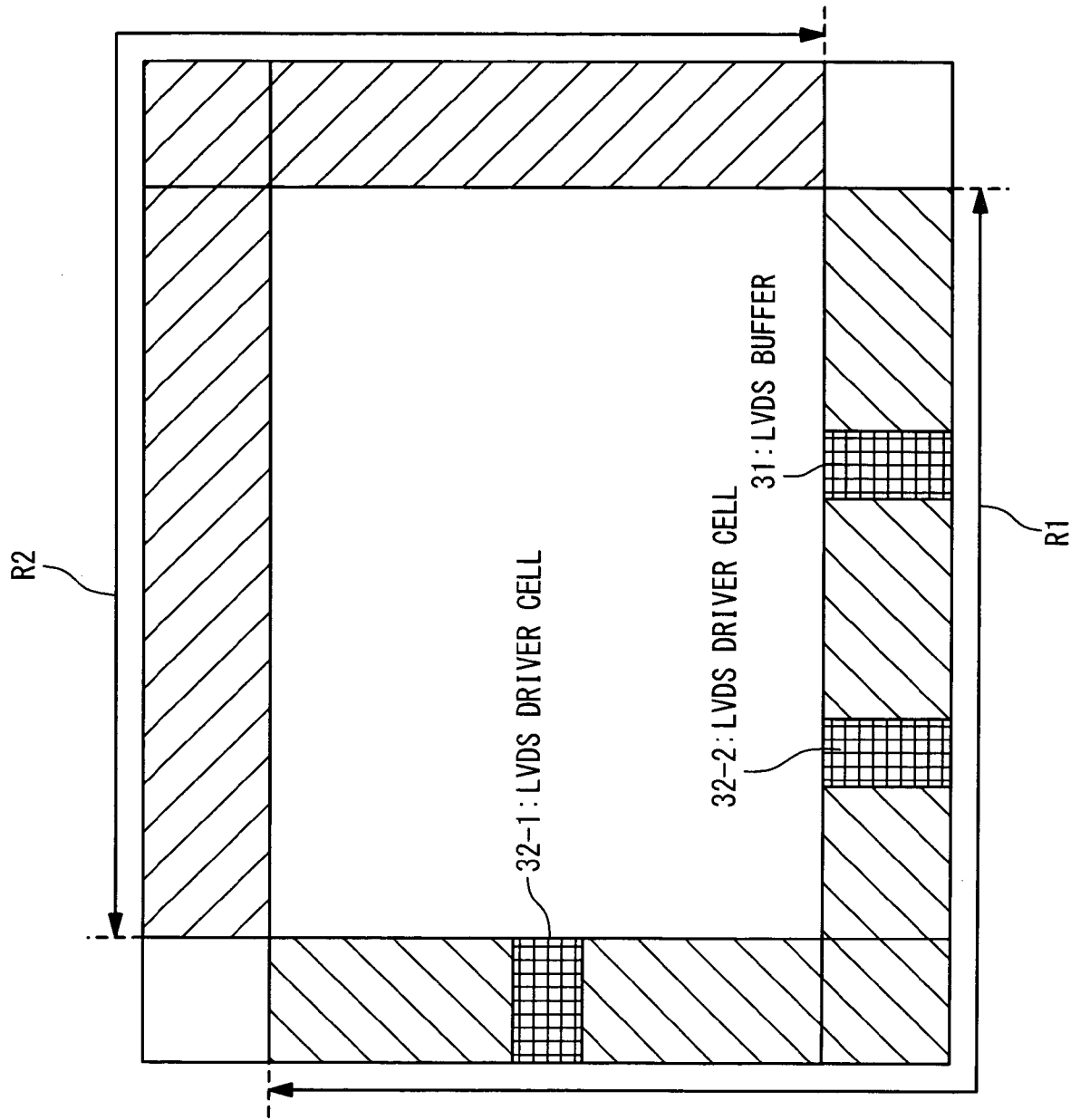
FIG. 11 is a schematic diagram showing still another example of placement of the LVDS buffer and the LVDS driver cell in the IO region.

FIG. 11 shows another case where the verification result is FAIL. In FIG. 11, an LVDS buffer 31 (controlled cell) is placed within the region R1. However, two LVDS driver cells 32-1 and 32-2 are placed within the region R1 (Step S47; No). In this case, an output short-circuit occurs. Therefore, the verification result is FAIL.

1-5. Effects

As described above, it is possible according to the present embodiment to verify (check) validity of the placement of the controlling cell and the controlled cell. In particular, it is possible to detect absence of the controlling cell required by the controlled cell, which can not be found by the conventional LVS verification. In other words, it is possible to verify whether or not the controlled cell operates normally. As a result, product deficiency caused by a placement error can be prevented, which improves production yield.

Moreover, according to the present embodiment, it is possible to perform the placement verification of the IO cells (Step S40) before the LVS verification. If the placement of IO cells in the IO region is at least completed, the placement verification of the IO cells is possible. For example, it is possible to perform the placement verification of the IO cells (Step S40) immediately after the IO cell placement process (Step S30). In this case, a placement error of the IO cells can be detected prior to the power routing process (Step S50) and the cell placement/routing process (Step S60). Since the placement error of the IO cells can be found in an early stage, TAT (Turn Around Time) can be greatly reduced.

2. Second Embodiment

In a second embodiment of the present invention, a case of IOLH will be described as another example. The IOLH is a technique for achieving trimming of output impedance (driving capability) of an IO buffer.

2-1. IOLH

Figure 12:
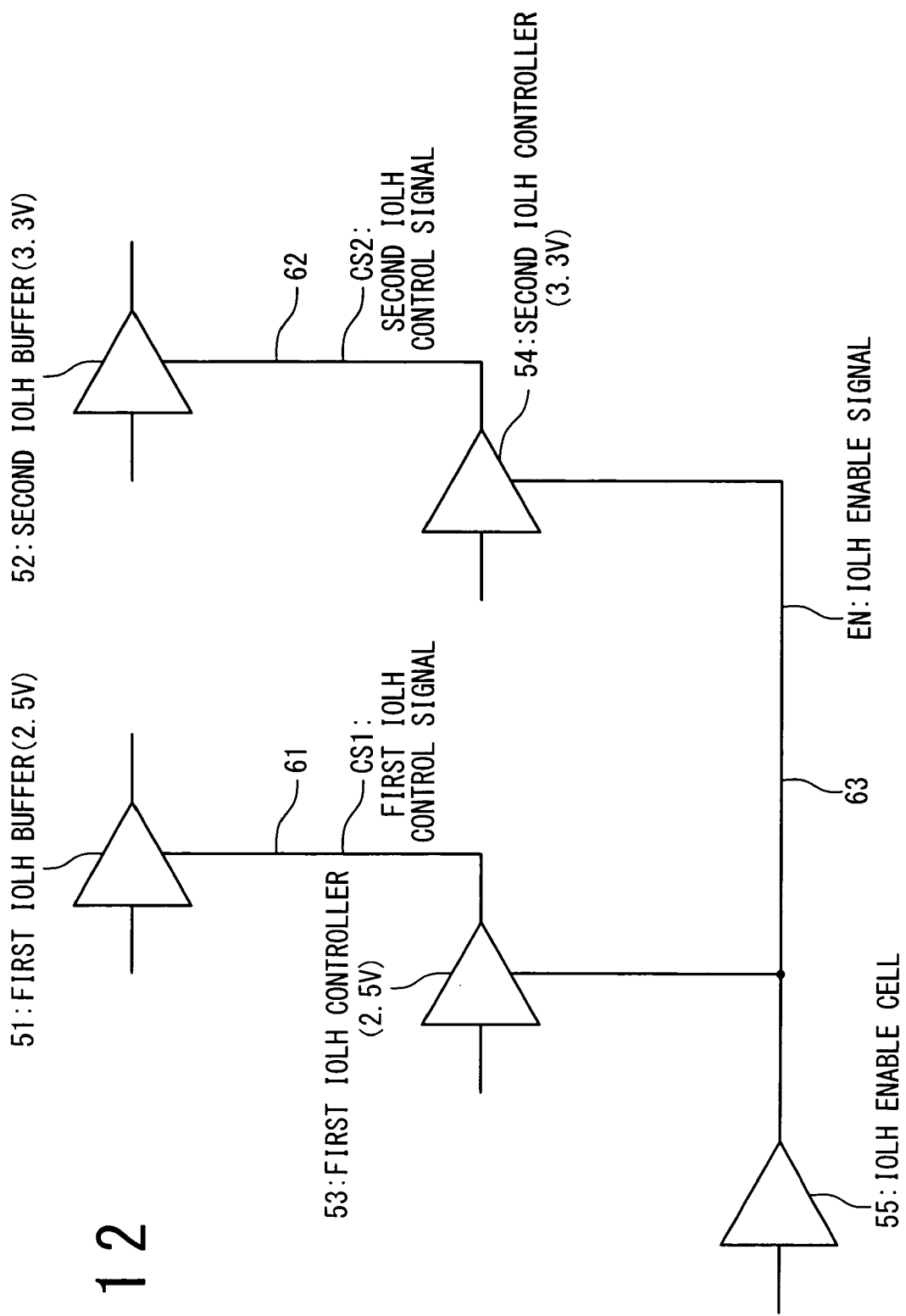
FIG. 12 is a circuit diagram showing a dependence relationship between an IOLH buffer, an IOLH controller and an IOLH enable cell in a second embodiment of the present invention.

FIG. 12 is a circuit diagram for explaining the IOLH. A first IOLH buffer 51, a second IOLH buffer 52, a first IOLH controller 53, a second IOLH controller 54 and an IOLH enable cell 55 are the IO cells to be placed in the IO region.

The first IOLH buffer 51 is an IO buffer operating with 2.5 V. The second IOLH buffer 52 is an IO buffer operating with 3.3 V. The first IOLH controller 53 is a circuit for adjusting (trimming) the output impedance of the first IOLH buffer 51. The second IOLH controller 54 is a circuit for adjusting the output impedance of the second IOLH buffer 52. The IOLH enable cell 55 is a circuit for activating the first IOLH controller 53 and the second IOLH controller 54.

The IO buffer (51, 52) includes a plurality of Pch/Nch transistor pairs. The output impedance (driving capability) of the IO buffer can be varied by changing the number of pairs to be used. The controller (53, 54) is a circuit for setting the number of pairs to be used. More specifically, the controller includes a comparator and a replica circuit of the IO buffer. The comparator makes a comparison between a voltage generated by the replica circuit and a voltage generated by using an external reference resistor. By changing the number of pairs used in the replica circuit, the number of pairs with which the output impedance of the replica circuit becomes substantially equal to the external reference resistance is determined. The controller outputs a control signal indicating the determined number of pairs to the IO buffer. The Pch/Nch transistor pairs used in the IO buffer are set by the control signal. It is thus possible to set the output impedance of the IO buffer to a desired value. Such the trimming of the output impedance is performed, for example, only once prior to product shipment in order to reduce manufacturing variability. The IOLH enable cell 55 activates the controller at the time of the trimming mode.

As shown in FIG. 12, the first IOLH controller 53 outputs a first IOLH control signal CS1 for adjusting the output impedance of the first IOLH buffer 51. The first IOLH control signal CS1 is supplied to the first IOLH buffer 51 through a first control signal interconnection 61. The first IOLH buffer 51 sets the output impedance in accordance with the first IOLH control signal CS1. Therefore, the first IOLH buffer 51 is the "controlled cell" and the first IOLH controller 53 is the controlling cell.

Similarly, the second IOLH controller 54 outputs a second IOLH control signal CS2 for adjusting the output impedance of the second IOLH buffer 52. The second IOLH control signal CS2 is supplied to the second IOLH buffer 52 through a second control signal interconnection 62. The second IOLH buffer 52 sets the output impedance in accordance with the second IOLH control signal CS2. Therefore, the second IOLH buffer 52 is the "controlled cell" and the second IOLH controller 54 is the "controlling cell".

Also, the IOLH enable cell 55 outputs an IOLH enable signal EN for activating the IOLH controllers 53 and 54. The IOLH enable signal EN is supplied to the IOLH controllers 53 and 54 through an enable signal interconnection 63. Each of the IOLH controllers 53 and 54 performs the trimming of the output impedance in response to the enable signal EN. Therefore, each of the IOLH controllers 53 and 54 is the "controlled cell" and the IOLH enable cell 55 is the "controlling cell".

It should be noted that the first IOLH controller 53 is not only the "controlling cell" with respect to the first IOLH buffer 51 but also the "controlled cell" with respect to the IOLH enable cell 55. Also, the second IOLH controller 54 is not only the "controlling cell" with respect to the second IOLH buffer 52 but also the "controlled cell" with respect to the IOLH enable cell 55. Even in this case of a hierarchical configuration, it is possible to achieve the IO placement verification as in the foregoing first embodiment.

Figure 13:
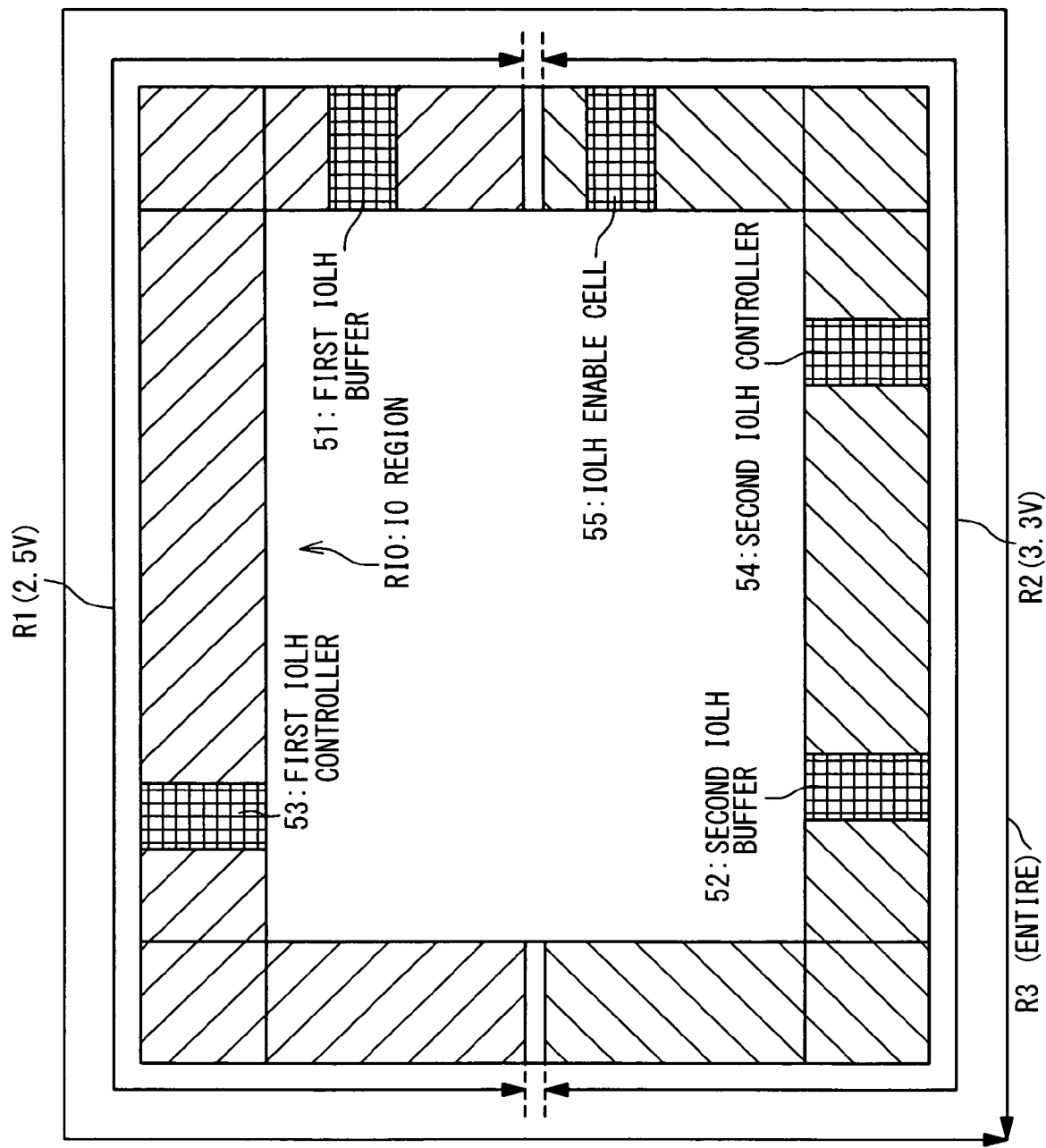
FIG. 13 is a schematic diagram showing an example of placement of the IOLH buffer, the IOLH controller and the IOLH enable cell in the IO region.

FIG. 13 shows one example of the IO cell placement in the present embodiment. The description overlapping with the first embodiment will be omitted as appropriate. In FIG. 13, the IO region RIO is divided into a region R1 and a region R2. The region R1 corresponds to a 2.5 V region. Therefore, the first control signal interconnection 61 in which the first IOLH control signal CS1 is transmitted is provided in the region R1. On the other hand, the region R2 corresponds to a 3.3V region. Therefore, the second control signal interconnection 62 in which the second IOLH control signal CS2 is transmitted is provided in the region R2. A region R3 corresponds to the entire IO region RIO. The enable signal interconnection 63 in which the IOLH enable signal EN is transmitted is provided in the region R3.

2-2. Cell Library

The configuration of the design system 1 according to the present embodiment is similar to that shown in FIG. 2. The cell library 20 includes cell data 22 of the IOLH buffers 51 and 52, the IOLH controllers 53 and 54, and the IOLH enable cell 55. FIG. 14 shows an example of the REQUIRE information and the GROUP information in the present embodiment.

The first IOLH buffer 51 is a controlled cell, and its IO cell data 22A includes the REQUIRE information. The signal attribute is "IOLH25" that represents the first IOLH control signal CS1, and the requiring cell group is "IOLH25".

The second IOLH buffer 52 is a controlled cell, and its IO cell data 22A includes the REQUIRE information. The signal attribute is "IOLH33" that represents the second IOLH control signal CS2, and the requiring cell group is "IOLH33".

The first IOLH controller 53 is a controlling cell and a controlled cell. Therefore, its cell data becomes a combination of the IO cell data 22B and 22A, and thus includes both of the GROUP information and the REQUIRE information. The signal attribute in the GROUP information is "IOLH25" that represents the first IOLH control signal CS1, and the cell group is "IOLH25" that represents the type of the self-cell. The signal attribute in the REQUIRE information is "IOLHEN" that represents the IOLH enable signal EN, and the requiring cell group is "IOLHEN".

The second IOLH controller 54 is a controlling cell and a controlled cell. Therefore, its cell data becomes a combination of the IO cell data 22B and 22A, and thus includes both of the GROUP information and the REQUIRE information. The signal attribute in the GROUP information is "IOLH33" that represents the second IOLH control signal CS2, and the cell group is "IOLH33" that represents the type of the self-cell. The signal attribute in the REQUIRE information is "IOLHEN" that represents the IOLH enable signal EN, and the requiring cell group is "IOLHEN".

The IOLH enable cell 55 is a controlling cell, and its IO cell data 22B includes the GROUP information. The signal attribute is "IOLHEN" that represents the IOLH enable signal EN, and the cell group is "IOLHEN" that represents the type of the self-cell.

FIG. 15 shows the region information 25 in the present embodiment. The region information 25 indicates a relationship between the "signal attribute" and the "region". It can be seen from FIG. 15 that a control signal whose signal attribute is "IOLH25" is transmitted within the region R1 (see also FIG. 13). Similarly, it can be seen that a control signal whose signal attribute is "IOLH33" is transmitted within the region R2, and a control signal whose signal attribute is "IOLHEN" is transmitted within the region R3 (entire IO region RIO).

2-3. IO Placement Verification

The flow of the IO placement verification (Step S40) in the present embodiment is the same as shown in FIG. 9. The description overlapping with the first embodiment will be omitted as appropriate.

The foregoing FIG. 13 shows a case where the verification result is PASS. In FIG. 13, a first IOLH buffer 51 (controlled cell) is placed within the region R1. The first IOLH control signal CS1 is transmitted in the region R1 (Step S43; Yes). Moreover, only one first IOLH controller 53 (controlling cell) required by the first IOLH buffer 51 is placed within the region R1 (Step S47; Yes). Therefore, the first IOLH buffer 51 can operate normally and an output short-circuit does not occur.

A first IOLH controller 53 (controlled cell) is placed within the region R3. The IOLH enable signal EN is transmitted in the region R3 (Step S43; Yes). Moreover, only one IOLH enable cell 55 (controlling cell) required by the first IOLH controller 53 is placed within the region R3 (Step S47; Yes). Therefore, the first IOLH controller 53 can operate normally and an output short-circuit does not occur.

A second IOLH buffer 52 (controlled cell) is placed within the region R2. The second IOLH control signal CS2 is transmitted in the region R2 (Step S43; Yes). Moreover, only one second IOLH controller 54 (controlling cell) required by the second IOLH buffer 52 is placed within the region R2 (Step S47; Yes). Therefore, the second IOLH buffer 52 can operate normally and an output short-circuit does not occur.

A second IOLH controller 54 (controlled cell) is placed within the region R3. The IOLH enable signal EN is transmitted in the region R3 (Step S43; Yes). Moreover, only one IOLH enable cell 55 (controlling cell) required by the second IOLH controller 54 is placed within the region R3 (Step S47; Yes). Therefore, the second IOLH controller 54 can operate normally and an output short-circuit does not occur.

Figure 16:
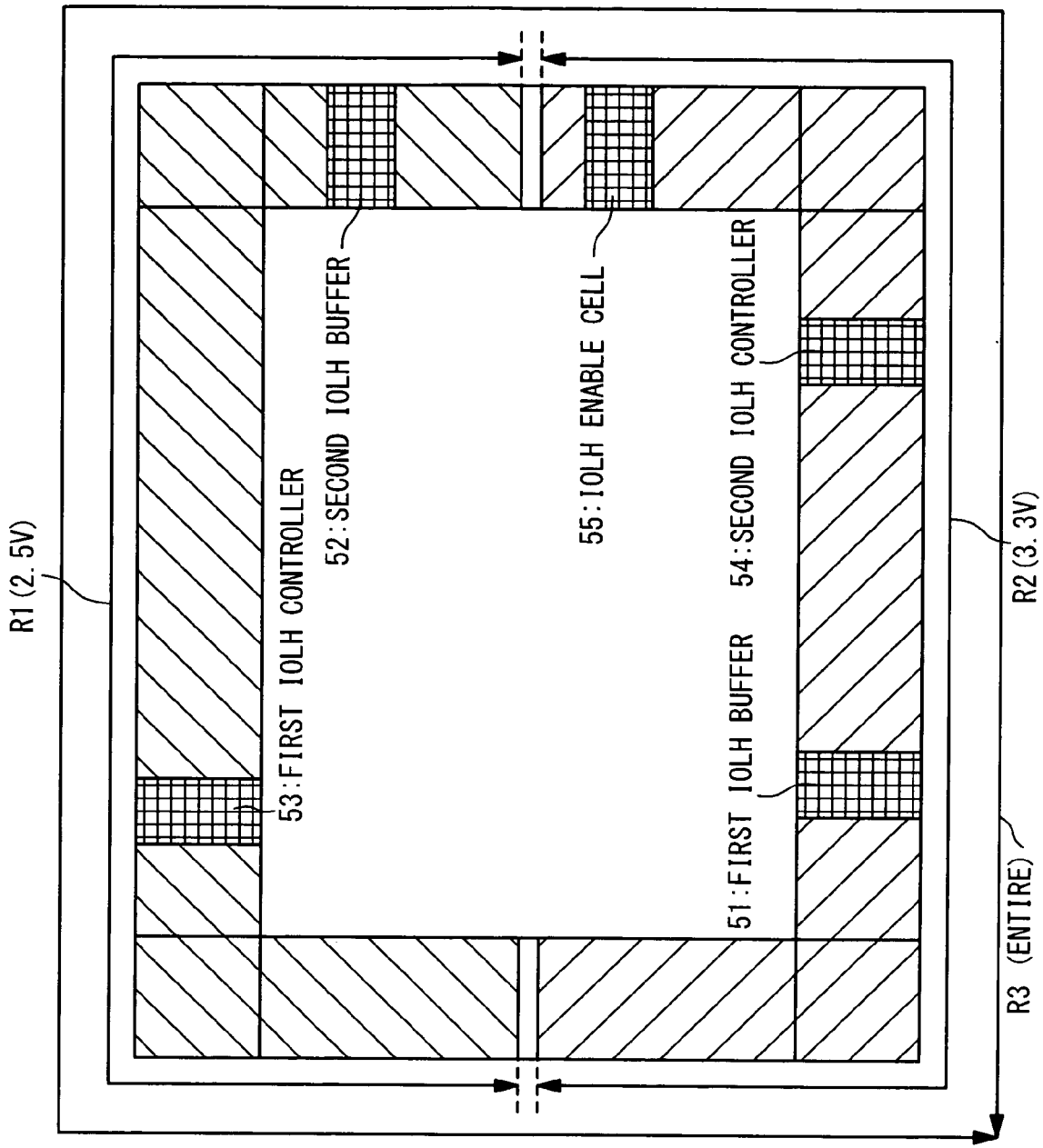
FIG. 16 is a schematic diagram showing another example of placement of the IOLH buffer, the IOLH controller and the IOLH enable cell in the IO region.

FIG. 16 shows a case where the verification result is FAIL. The signal attribute in the REQUIRE information of the first IOLH buffer 51 is "IOLH25", as shown in FIG. 14. The region associated with the signal attribute "IOLH25" is the region R1, as shown in FIG. 15. In FIG. 16, however, the first IOLH buffer 51 is placed within the region R2. This does not accord with the specified region R1 (Step S43; No). Since the first IOLH buffer 51 is not placed in the region R1 in which the first IOLH control signal CS1 is transmitted, the verification result becomes FAIL.

Moreover, the second IOLH buffer 52 is placed within the region R1. This also does not accord with the specified region R2 (Step S43; No). Therefore, the verification result becomes FAIL.

Figure 17:
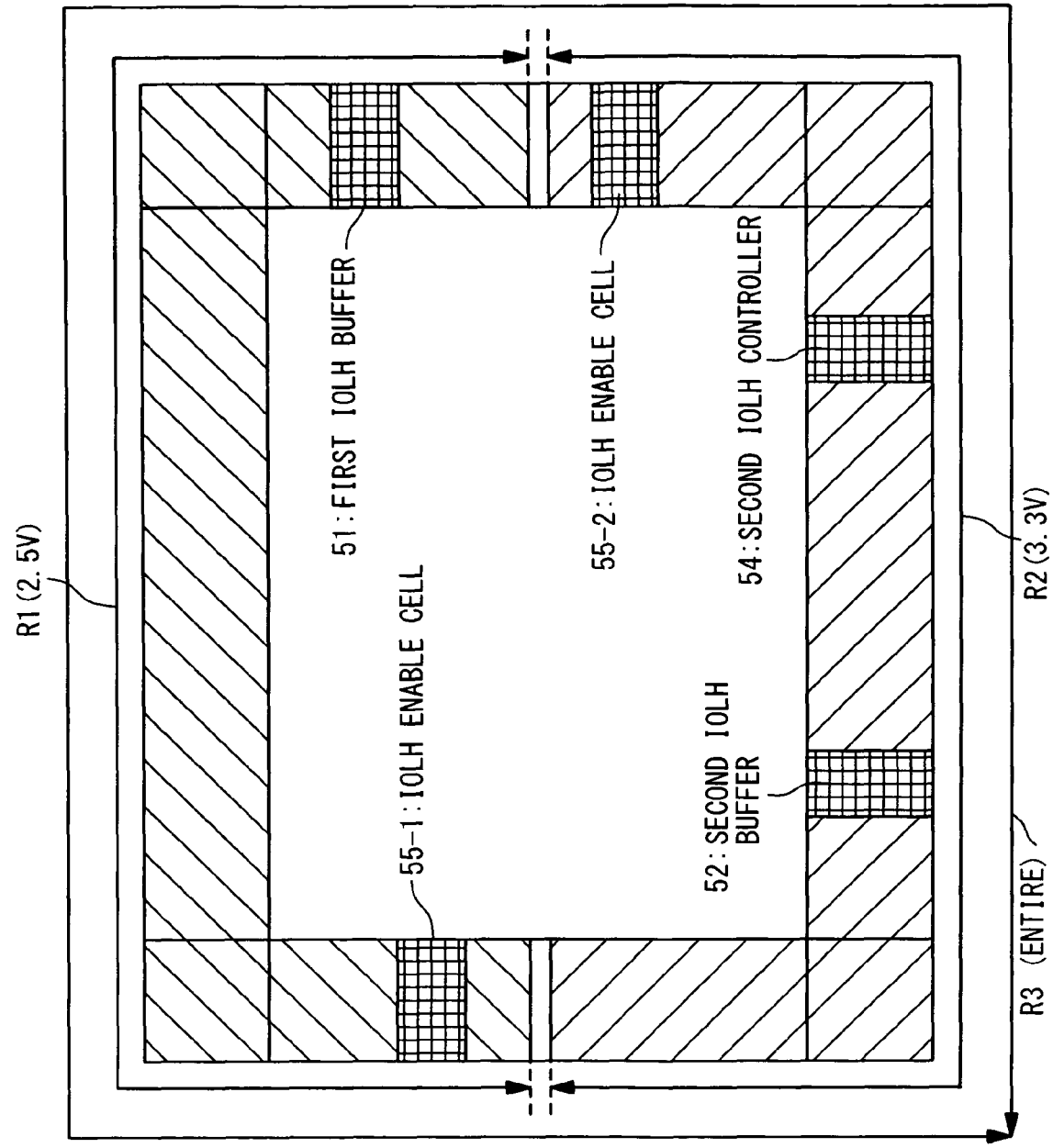
FIG. 17 is a schematic diagram showing still another example of placement of the IOLH buffer, the IOLH controller and the IOLH enable cell in the IO region.

FIG. 17 shows another case where the verification result is FAIL. In FIG. 17, the first IOLH buffer 51 (controlled cell) is placed within the region R1. The first IOLH control signal CS1 is transmitted in the region R1 (Step S43; Yes). However, there is no first IOLH controller 53 (controlling cell) required by the first IOLH buffer 51 in the same region R1 (Step S47; No). In this case, the first IOLH buffer 51 can not operate normally. Therefore, the verification result becomes FAIL.

Moreover, two IOLH enable cells 55-1 and 55-2 are placed within the region R3 (Step S47; No). In this case, an output short-circuit occurs. Therefore, the verification result becomes FAIL.

As described above, it is possible to perform the IO placement verification as in the foregoing first embodiment, even in the case of the hierarchical configuration. As a result, the same effects as in the first embodiment can be obtained.

3. Third Embodiment

Figure 18:
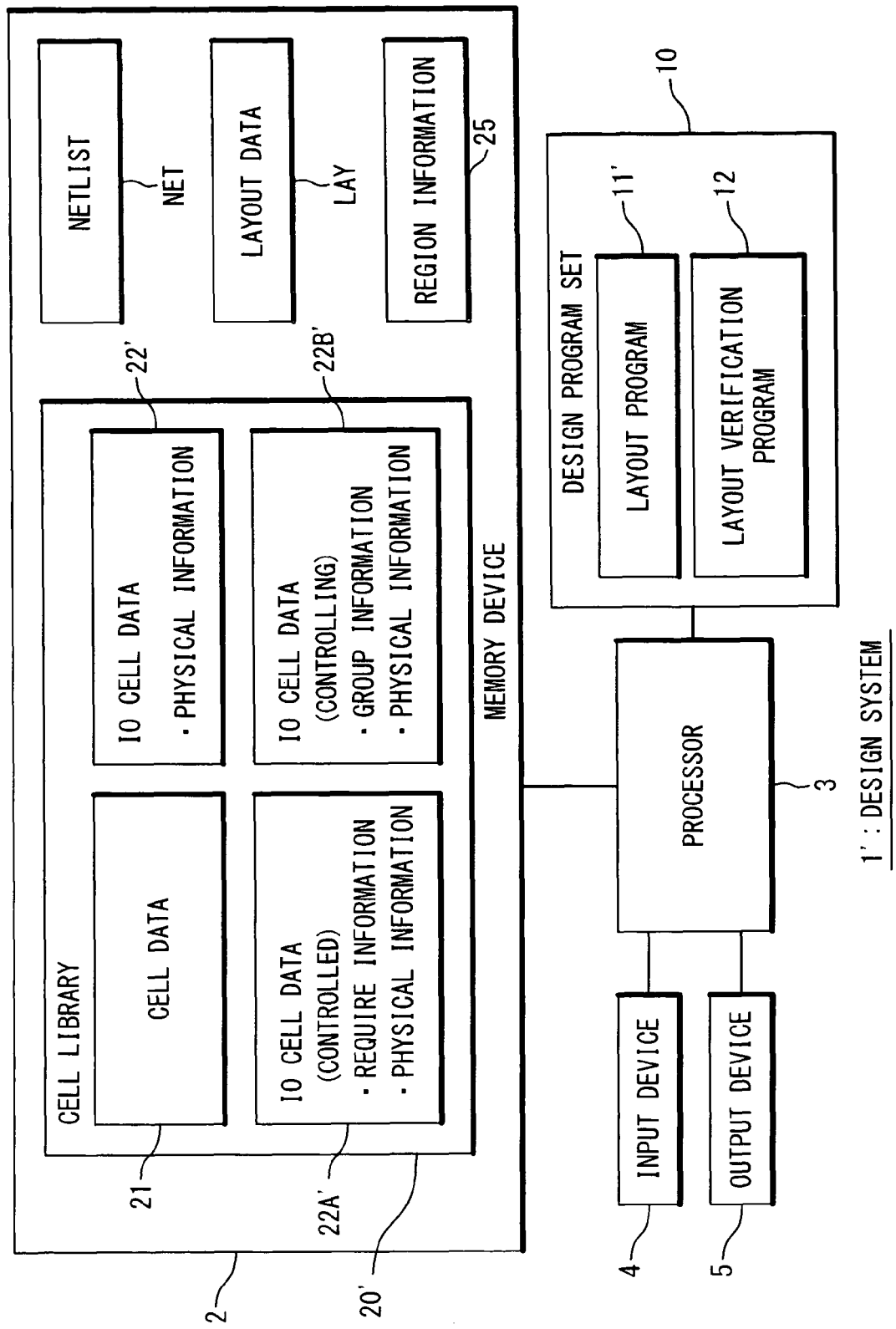
FIG. 18 is a block diagram showing a configuration of a design system according to a third embodiment of the present invention.

FIG. 18 is a block diagram showing a configuration example of a design system 1' according to a third embodiment of the present invention. The description overlapping with the foregoing embodiments will be omitted as appropriate. In the present embodiment, the design program set 10 includes a layout program 11' instead of the above-mentioned layout program 11. Also, a cell library 20' instead of the above-mentioned cell library 20 is stored in the memory device 2. The cell library 20' includes IO cell data 22', 22A' and 22B' instead of the IO cell data 22, 22A and 22B.

As compared with the foregoing embodiments, "physical information" is further given to each of the IO cell data 22', 22A' and 22B'. The physical information indicates positions of terminals of interconnections included in the self-cell.

Figure 19:
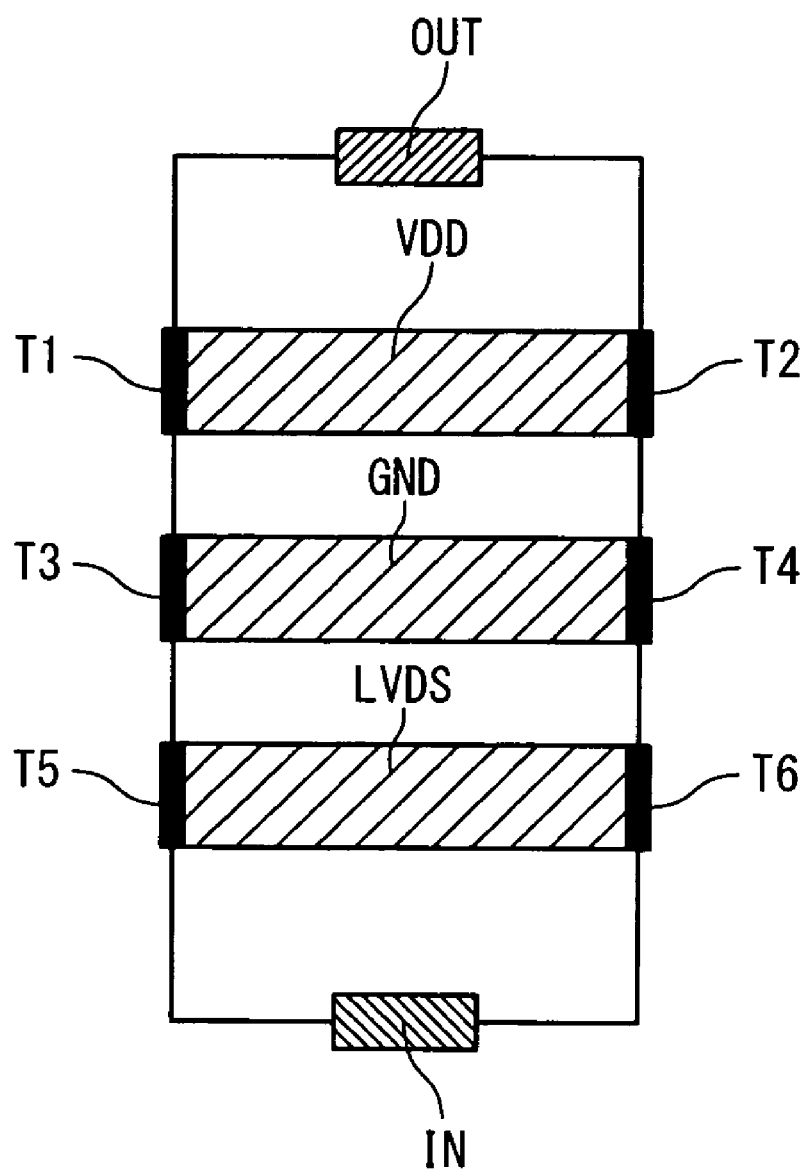
FIG. 19 is a conceptual diagram showing an example of physical information in the third embodiment.

For example, FIG. 19 conceptually shows an IO cell related to the LVDS. The IO cell has an input terminal IN, an output terminal OUT, a power line VDD, a ground line GND and an interconnection LVDS for the LVDS control signal CS. The physical information indicates positions of terminals T1 and T2 of the power line VDD, terminals T3 and T4 of the ground line GND, and terminals T5 and T6 of the LVDS control signal CS. The other information (REQUIRE information, GROUP information) is the same as in the foregoing embodiments.

According to the present embodiment, the region information 25 is generated from the "physical information" of the IO cells placed in the IO region RIO. That is to say, the region information 25 is not given as a library but is "dynamically" determined based on the result of the IO cell placement at the Step S30. The layout program 11' according to the present embodiment has a function of determining the region information 25 based on the IO cell placement condition.

Figure 20:
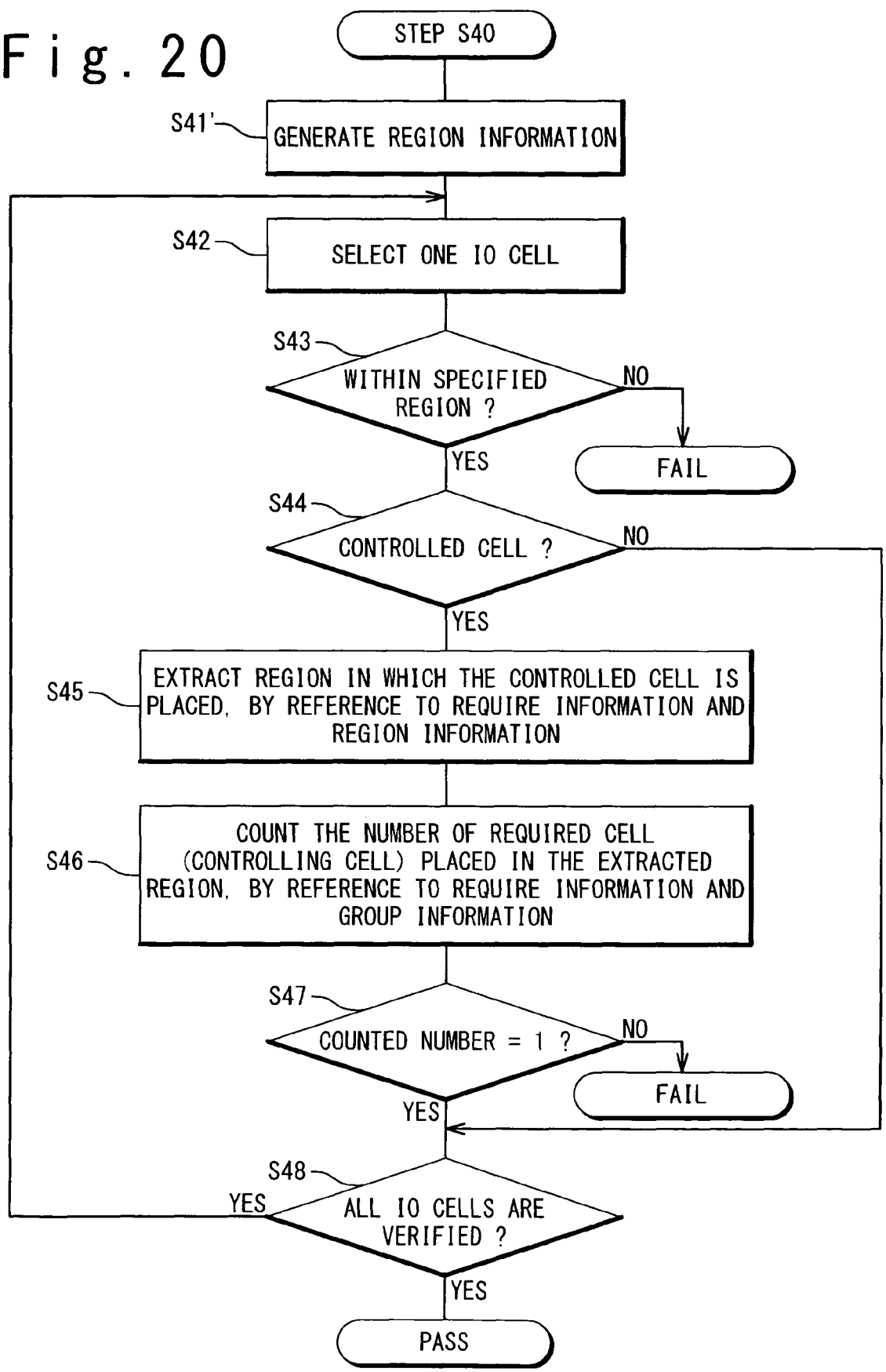
FIG. 20 is a flowchart showing an IO placement verification method according to the third embodiment.

FIG. 20 is a flowchart showing the details of Step S40 according to the present embodiment. As compared with the flow shown in FIG. 9, Step S41' is executed instead of Step S41. The processing after Step S42 is the same as in the foregoing embodiments.

In Step S41', the region information 25 is generated based on the result of the IO cell placement and the physical information. First, a location of the interconnection for the control signal (CS, CS1, CS2, EN) is detected by reference to the physical information of the IO cells placed in the IO region RIO. The control signal interconnection (40, 61, 62, 63) for transmitting the control signal (CS, CS1, CS2, EN) can be recognized by tracing the detected interconnection. That is to say, it is possible to generate the region information 25 by extracting a region in which the interconnection for transmitting the control signal is consecutively located.

For example, the physical information of the IO cell shown in FIG. 19 includes the positions of the terminals T5 and T6 for the LVDS control signal CS. A location of the interconnection LVDS for the LVDS control signal CS is detected by reference to the positions of the terminals T5 and T6. It is possible to recognize the control signal interconnection 40 for transmitting the LVDS control signal CS by connecting the detected interconnection LVDS between adjacent cells. A region in which the interconnection LVDS continues corresponds to the region R1 or the region R2 in which the control signal interconnection 40 is to be provided. In this manner, the region information 25 can be generated and obtained. The generated region information 25 is stored in the memory device 2. The same applies to the case of the IOLH.

According to the present embodiment, the same effects as in the foregoing embodiments can be obtained. Moreover, the region information 25 can be generated dynamically in accordance with the IO cell placement.

It is apparent that the present invention is not limited to the above embodiments and may be modified and changed without departing from the scope and spirit of the invention.

What is claimed is:

1. A method of verifying a semiconductor integrated circuit in an IO region of which a controlling cell and a controlled cell controlled by a control signal output from said controlling cell are placed, said method comprising:
    providing a library that includes requirement information specifying said controlling cell required by said controlled cell;
    obtaining a region information indicating a region within said IO region in which a signal interconnection through which said control signal is transmitted is provided; and
    verifying, by using a computer, whether or not said specified controlling cell is placed within said region, in a case where said controlled cell is placed within said region,
    wherein said library includes IO cell data of plural kinds of IO cells including said controlling cell and said controlled cell, and each of said IO cell data associated with each IO cell includes physical information indicating positions of terminals of interconnections included in said each IO cell, and
    wherein said obtaining said region information comprises:
        detecting a location of an interconnection for transmitting said control signal, by reference to said physical information of IO cells placed in said IO region; and
        generating said region information by extracting a region in which said interconnection for transmitting said control signal is consecutively located.

2. The method according to claim 1, wherein said library includes said region information in addition to said requirement information, and
    wherein said region information is read out from said library.

3. The method according to claim 1, wherein said verifying comprises:
    selecting said controlling cell or said controlled cell placed within said IO region as a selected cell; and
    verifying whether or not said selected cell is placed within said region indicated by said region information.

4. The method according to claim 1, wherein said verifying is performed before a power routing.

5. A method of verifying a semiconductor integrated circuit in an IO region of which a controlling cell and a controlled cell controlled by a control signal output from said controlling cell are placed, said method comprising:
    providing a library that includes requirement information specifying said controlling cell required by said controlled cell;
    obtaining a region information indicating a region within said IO region in which a signal interconnection through which said control signal is transmitted is provided; and
    verifying, by using a computer, whether or not said specified controlling cell is placed within said region, in a case where said controlled cell is placed within said region,
    wherein said verifying comprises:
        selecting said controlled cell placed within said IO region;
        extracting said region in which said selected controlled cell is placed, by reference to said region information; and
        counting a number of said specified controlling cell placed within said extracted region.

6. The method according to claim 5, wherein said verifying further comprises outputting an error signal if said number of specified controlling cell placed within said extracted region is other than 1.

7. A design program recorded on a non-transitory computer-readable storage medium that, when executed, causes a computer to perform a verification process of a semiconductor integrated circuit in an IO region of which a controlling cell and a controlled cell controlled by a control signal output from said controlling cell are placed, said verification process comprising:
    reading a library that includes requirement information specifying said controlling cell required by said controlled cell from a memory device;
    obtaining a region information indicating a region within said IO region in which a signal interconnection through which said control signal is transmitted is provided; and
    verifying whether or not said specified controlling cell is placed within said region, in a case where said controlled cell is placed within said region,
    wherein said library includes IO cell data of plural kinds of IO cells including said controlling cell and said controlled cell, and each of said IO cell data associated with each IO cell includes physical information indicating positions of terminals of interconnections included in said each IO cell, and wherein said obtaining comprises:
  detecting a location of an interconnection for transmitting said control signal, by reference to said physical information of IO cells placed in said IO region; and
  generating said region information by extracting a region in which said interconnection for transmitting said control signal is consecutively located.

8. The design program according to claim 7, wherein said library includes said region information in addition to said requirement information, and
  wherein said region information is read out from said library.

9. The design program according to claim 7, wherein said verifying comprises:
  selecting said controlling cell or said controlled cell placed within said IO region as a selected cell; and
  verifying whether or not said selected cell is placed within said region indicated by said region information.

10. The design program according to claim 7, wherein said verifying is performed before a power routing.

11. A design program recorded on a non-transitory computer-readable storage medium that, when executed, causes a computer to perform a verification process of a semiconductor integrated circuit in an IO region of which a controlling cell and a controlled cell controlled by a control signal output from said controlling cell are placed, said verification process comprising:
  reading a library that includes requirement information specifying said controlling cell required by said controlled cell from a memory device;
  obtaining a region information indicating a region within said IO region in which a signal interconnection through which said control signal is transmitted is provided; and
  verifying whether or not said specified controlling cell is placed within said region, in a case where said controlled cell is placed within said region,
  wherein said verifying comprises:
    selecting said controlled cell placed within said IO region;
    extracting said region in which said selected controlled cell is placed, by reference to said region information; and
    counting a number of said specified controlling cell placed within said extracted region.

12. The design program according to claim 11, wherein said verifying further comprises outputting an error signal if said number of specified controlling cell placed within said extracted region is other than 1.

* * * * *